(12) United States Patent
Hewett et al.

(10) Patent No.: US 6,534,328 B1
(45) Date of Patent: Mar. 18, 2003

(54) METHOD OF MODELING AND CONTROLLING THE ENDPOINT OF CHEMICAL MECHANICAL POLISHING OPERATIONS PERFORMED ON A PROCESS LAYER, AND SYSTEM FOR ACCOMPLISHING SAME

(75) Inventors: Joyce S. Oey Hewett, Austin, TX (US); Alexander J. Pasadyn, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 20 days.

(21) Appl. No.: 09/909,162

(22) Filed: Jul. 19, 2001

(51) Int. Cl.⁷ .......................... H01L 21/00; H01L 21/66; H01L 21/302

(52) U.S. Cl. ................... 438/8; 438/5; 438/7; 438/16; 438/692

(58) Field of Search ............................. 438/5, 7, 8, 16, 438/692; 451/5, 6

(56) References Cited

U.S. PATENT DOCUMENTS

| 6,110,752 A | * | 8/2000 | Litvak ........................... 438/8 |
| 6,268,224 B1 | * | 7/2001 | Miller et al. ................... 438/10 |
| 6,274,478 B1 | * | 8/2001 | Farkas .......................... 438/626 |
| 6,296,548 B1 | * | 10/2001 | Wiswesser ...................... 451/8 |
| 6,309,276 B1 | * | 10/2001 | Tsai et al. ....................... 451/5 |
| 6,336,841 B1 | * | 1/2002 | Chang .......................... 451/10 |
| 6,379,980 B1 | * | 4/2002 | Toprac ........................... 438/8 |
| 6,399,501 B2 | * | 6/2002 | Birang et al. ............... 438/692 |
| 6,425,801 B1 | * | 7/2002 | Takeishi et al. ............... 451/5 |

* cited by examiner

Primary Examiner—Alexander Ghyka
(74) Attorney, Agent, or Firm—Williams, Morgan & Amerson, P.C.

(57) ABSTRACT

The present invention is generally directed to a method of modeling and controlling the endpoint of chemical mechanical polishing operations performed on a process layer, and a system for accomplishing same. In one illustrative embodiment, the method comprises providing a first wafer having a process layer formed thereabove, determining a duration of an endpoint polishing process performed on the process layer on the wafer, providing a second wafer having a process layer formed thereabove, and modifying at least one parameter of the endpoint polishing process to be performed on the process layer formed above the second wafer based upon a variance between the determined duration of the endpoint polishing process performed on the process layer on the first wafer and a target value for the duration of the endpoint polishing process.

22 Claims, 5 Drawing Sheets

METHOD OF MODELING AND CONTROLLING THE ENDPOINT OF CHEMICAL MECHANICAL POLISHING OPERATIONS PERFORMED ON A PROCESS LAYER, AND SYSTEM FOR ACCOMPLISHING SAME

BACKGROUND OF THE INVENTION

1. Field of the Invention

The present invention is generally directed to the field of semiconductor manufacturing, and, more particularly, to a method of modeling and controlling the endpoint of chemical mechanical polishing operations performed on a process layer, and system for accomplishing same.

2. Description of the Related Art

In modem integrated circuit devices, millions of transistors are formed above a surface of a semiconducting substrate. To perform their intended functions, these transistors, or groups of transistors, are electrically coupled together by many levels of conductive interconnections, i.e., conductive metal lines and plugs. These conductive lines and plugs allow electrical signals to propagate throughout the integrated circuit device. As the performance of integrated circuit devices has continued to increase, copper has become the material of choice for conductive interconnections in high performance devices. This is due, at least in part, to the lower resistance of copper as compared to other metals, e.g., aluminum, commonly employed in making such conductive interconnections.

Typically, conductive interconnections, e.g., lines, comprised of copper are created by forming a patterned layer of insulating material, e.g., silicon dioxide, having openings formed therein, conformally depositing a barrier metal layer, e.g, tantalum, above the patterned layer of insulating material and in the openings in the layer, conformally depositing a relatively thin copper seed layer above the barrier metal layer, and forming a relatively thick layer of copper above the patterned layer of insulating material by known electroplating techniques. Thereafter, one or more chemical mechanical polishing (CMP) operations are performed to remove the copper material positioned above the surface of the patterned insulating layer, thereby defining a plurality of copper interconnections in the openings in the patterned layer of insulating material.

Typically, the polishing operations performed on the layer of copper is a two-step process, i.e., a first timed polishing operation wherein the bulk of the excessive copper is removed at a relatively rapid removal rate, and a second endpoint polishing process at a relatively slow removal rate. This second process is typically endpointed using an optical metrology tool that detects when the copper is substantially removed from the area under observation.

However, the above-described optical endpointing technique is not without its draw-backs. For example, the time for the second process to endpoint may vary, and such variations may occur from wafer to wafer. As a result, manufacturing efficiencies may be decreased. Moreover, such endpoint variations may be indicative of other problems in the polishing system or tool that tends to decrease productivity.

The present invention is directed to a method that may solve, or at least reduce, some or all of the aforementioned problems.

SUMMARY OF THE INVENTION

The present invention is generally directed to a method of modeling and controlling the endpoint of chemical mechanical polishing operations performed on a process layer, and a system for accomplishing same. In one illustrative embodiment, the method comprises providing a first wafer having a process layer formed thereabove, determining a duration of an endpoint polishing process performed on the process layer on the first wafer, providing a second wafer having a process layer formed thereabove, and modifying at least one parameter of the endpoint polishing process to be performed on the process layer formed above the second wafer based upon a variance between the determined duration of the endpoint polishing process performed on the process layer on the first wafer and a target value for the duration of the endpoint polishing process.

BRIEF DESCRIPTION OF THE DRAWINGS

The invention may be understood by reference to the following description taken in conjunction with the accompanying drawings, in which like reference numerals identify like elements, and in which.

Figure 1A:
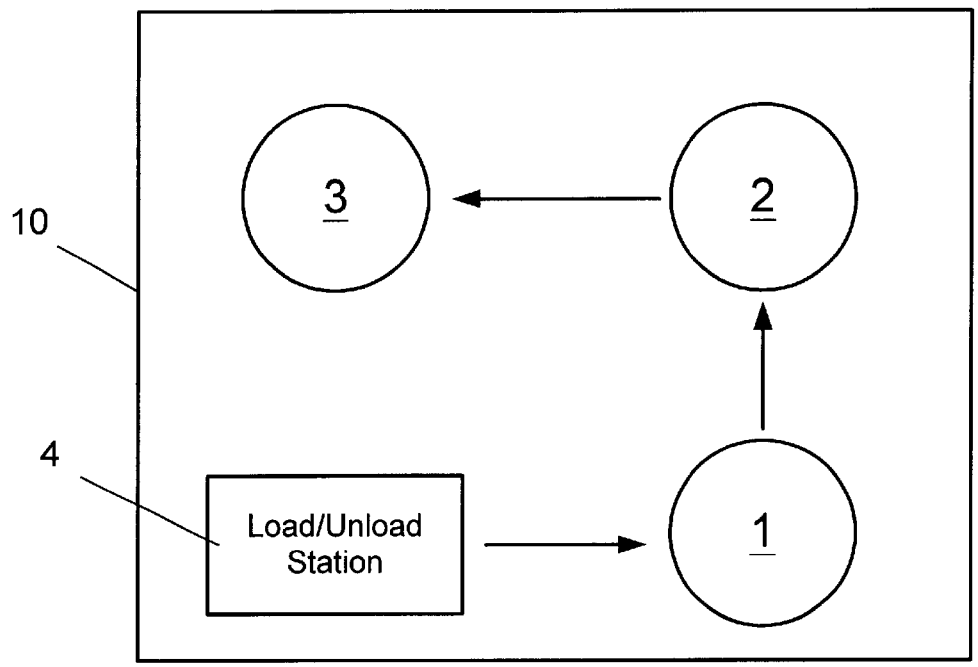
FIG. 1A is schematic view of a polishing tool that may be used with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention.

In general, the present invention is directed to a method of modeling and controlling the endpoint of chemical mechanical polishing operations performed on a process layer, and system for accomplishing same. As will be readily apparent to those skilled in the art upon a complete reading of the present application, the present method is applicable to a variety of technologies, e.g., NMOS, PMOS, CMOS, etc., is readily applicable to a variety of devices, including, but not limited to, logic devices, memory devices, etc. Moreover, the present invention is applicable to polishing process layers comprised of a variety of different materials.

FIG. 1A is a schematic depiction of an Applied Materials Mirra copper polishing tool, a polishing tool 10 that may be used with the present invention. The Applied Materials tool may be purchased from Applied Materials located in Santa Clara, Calif. The polishing tool 10 is comprised of three polishing platens, platen 1, platen 2 and platen 3, and a load/unload station 4. Other utilities present within the tool 10 are not depicted for purposes of clarity. The polishing tool 10 may be used in forming conductive interconnections comprised of copper or other metals in modem integrated circuit devices. In general, as described more fully below, each wafer is subjected to various polishing operations at each of the platens 1–3. Wafers are processed at all four stations, i.e., platens 1–3 and the load/unload station 4, in parallel. After completion of the longest process time, all wafers are moved to the next station.

Figure 1B:
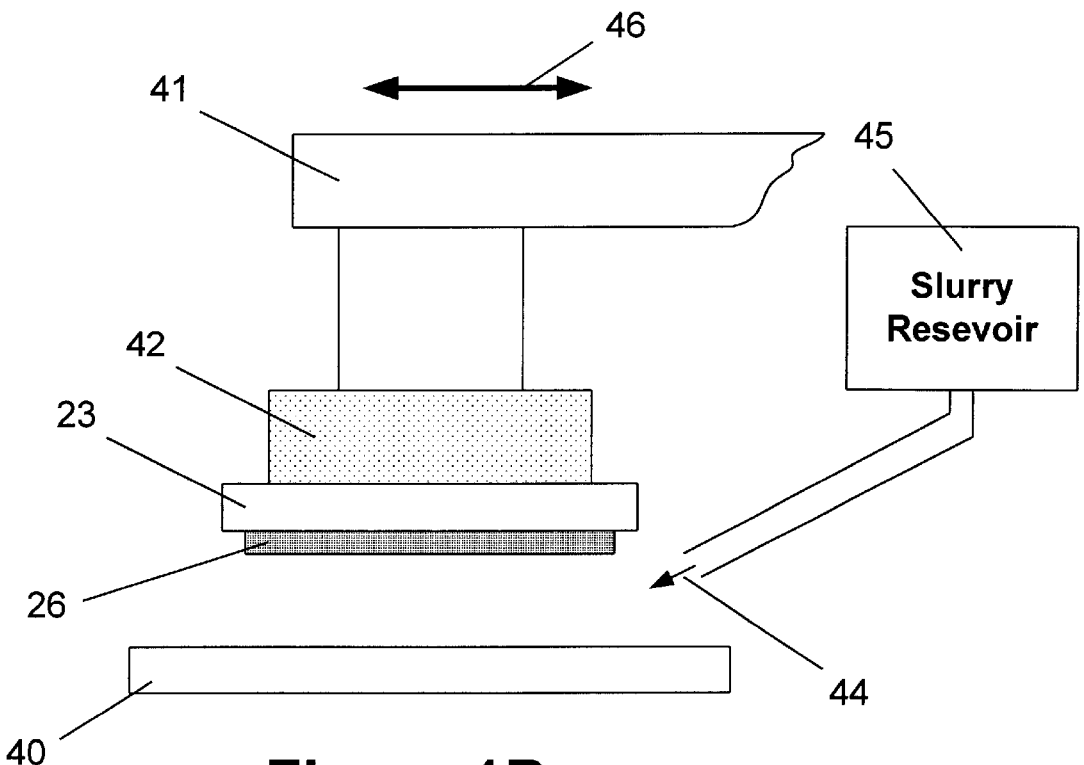
FIG. 1B is a schematic view of additional components of the polishing tool.

Those skilled in the art will recognize that the polishing tool 10 includes many other features not depicted in FIG. 1A. For example, as depicted in FIG. 1B, at each platen the polishing tool 10 has a rotating polishing pad 40, a polishing arm 41, and a wafer carrier head 42. A wafer 23, having a process layer 26 formed thereon, is secured to the carrier head 42, typically by vacuum pressure. A polishing slurry 44 from a slurry reservoir 45 is introduced between the polishing pad 40 and the process layer 26. Thereafter, the polishing pad 40 is rotated, and a downforce is applied by the polishing arm 41 to urge the process layer 26 into engagement with the polishing pad 40. In addition, the wafer 23 may also be rotated and the polishing arm 41 may oscillate across the pad 40 in the direction indicated by the double arrow 46. The polishing slurry 44 may be introduced constantly or intermittently as the polishing operations continue. After several wafers, or lots of wafers, have been polished, the polishing pad 40 may become "glazed," i.e., residual amounts of the polishing material and other by-products of the polishing process tend to accumulate in and on the pad 40. At that time, the pad 40 may be re-conditioned through use of a pad conditioner (not shown). In general, the pad conditioner removes some or all of the residual materials in the pad 40 and reconditions the surface of the polishing pad 40.

Figure 2:
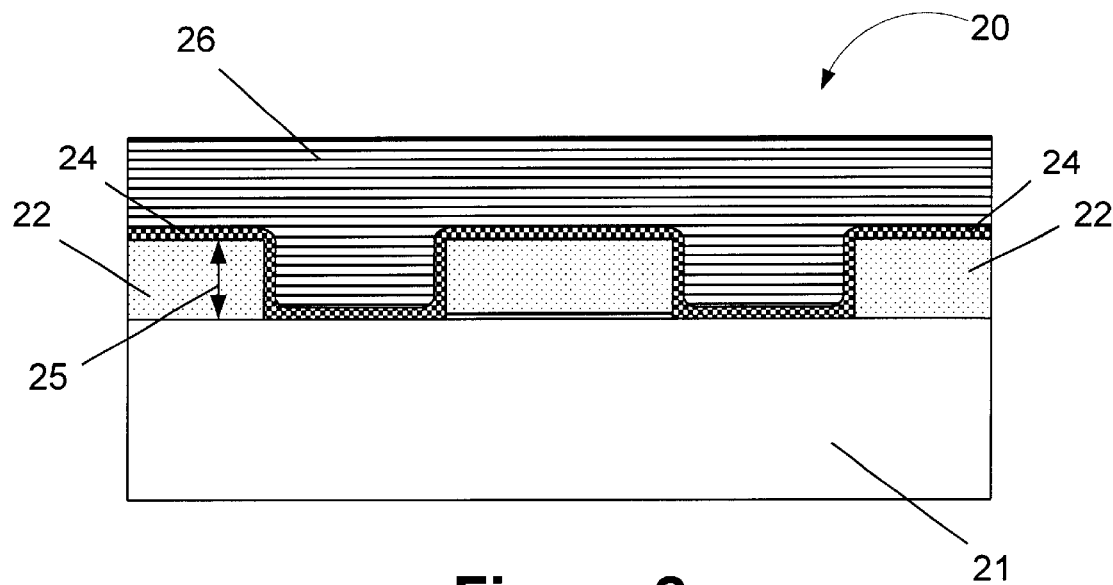
FIG. 2 is a cross-sectional view of a partially formed integrated circuit device comprised of a layer of metal formed above a patterned layer of insulating material.
Figure 3:
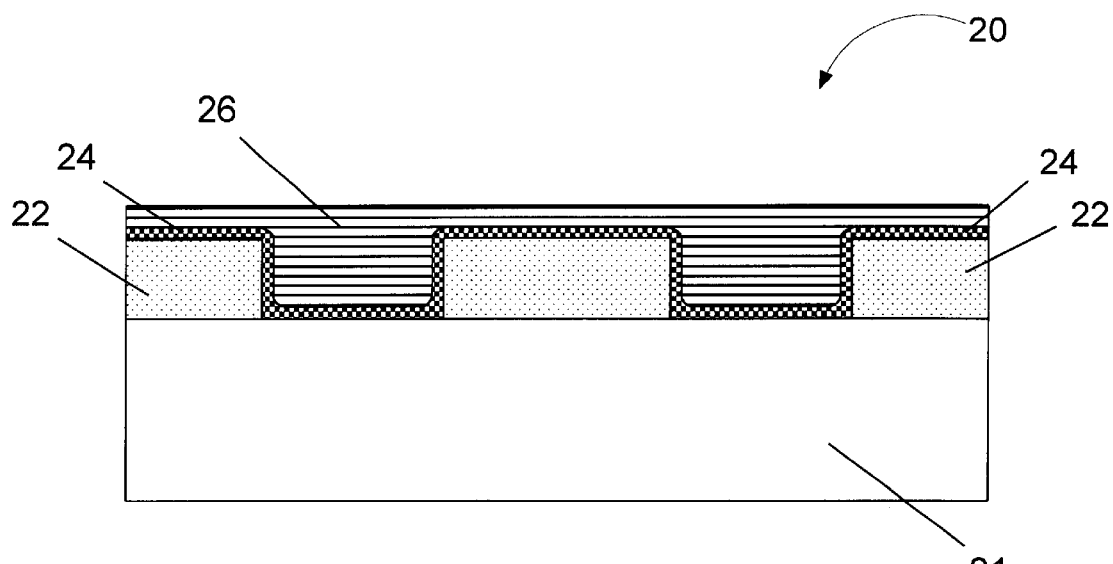
FIGS. 3 is a cross-sectional view of the device shown in FIG. 2 after a majority of the layer of metal has been removed at a first polishing platen of the polishing tool.

FIGS. 2–6 are cross-sectional views of a partially formed integrated circuit device that will be used to describe the various polishing operations performed at each of the platens 1–3. As shown in FIG. 2, the partially formed integrated circuit device 20 is comprised of a patterned layer of insulating material 22 formed above a structure 21, a barrier metal layer 24, and a process layer 26, e.g., copper. The patterned layer of insulating material 22 has a thickness 25, as shown in FIG. 2. The structure 21 is intended to be representative in nature in that it may be a semiconducting substrate, a previously formed layer of material, e.g., a layer of silicon dioxide, or a previously formed stack of layers of insulating material having a plurality of conductive interconnections formed in each layer.

The various layers depicted in FIG. 2 may be comprised of a variety of materials, and they may be formed by a variety of techniques. For example, the structure 21 may be a layer of silicon dioxide that is formed by a chemical vapor deposition ("CVD") process using TEOS as a constituent gas, and it may have a thickness ranging, for example, from approximately 1000–3000 nm. A patterned layer of insulating material 22 is positioned above the structure 21 and may be formed from a variety of materials, e.g., silicon dioxide, silicon nitride, HSQ, materials having a dielectric constant less than 3, etc., and it may have a thickness ranging, for example, from approximately 500–1500 nm. The patterned layer of insulating material 22 may be formed by blanket depositing a layer of insulating material, and, thereafter, patterning the layer of material using known photolithography and etching techniques to result in the patterned layer of insulating material 22 shown in FIG. 2.

Thereafter, a barrier metal layer 24 may be conformally deposited above the patterned layer of insulating material 22 using a variety of process methods, e.g., CVD, plasma enhanced CVD ("PECVD"), physical vapor deposition ("PVD"), sputtering, etc. The barrier metal layer 24 may be comprised of a variety of materials, and its thickness may vary. In one illustrative embodiment, where conductive interconnections comprised of copper are being formed, the barrier metal layer 24 is comprised of tantalum, and it may have a thickness ranging, for example, from approximately 10–30 nm. Of course, the barrier metal layer 24 may not be required in all applications of the present invention.

Thereafter, a process layer 26 comprised of, for example, copper, is formed above the barrier metal layer 24 by known electroplating techniques. Typically, in the case where the process layer 26 is comprised of copper, this process involves the formation of a copper seed layer (not shown) above the barrier metal layer 24, and, thereafter, positioning the partially formed integrated circuit device 20 in an electroplating bath to form the process layer 26 comprised of copper. The process layer 26 comprised of copper may have a thickness (above the patterned insulating layer 22) that ranges, for example, from approximately 500–1500 nm.

The present invention will now be further described with reference to a specific embodiment wherein the process layer 26 is comprised of copper. However, the present invention should not be considered as limited to the removal of layers of copper, unless such limitations are specifically set forth in the appended claims. For example, the present invention may be used in polishing layers comprised of aluminum and tungsten. At platen 1 of the polishing tool 10, a majority, and typically the bulk, of the copper layer 26 is removed. A relatively high polisher arm 41 downforce is used to achieve an aggressive removal rate on the order of approximately 8–16 nm/sec (80–160 Å/sec) of copper. The polishing process performed at platen 1 may be a timed process whereby, in one application, approximately 50–80% of the copper layer 26 above the patterned layer of insulating material 22 is removed. FIG. 2 depicts the wafer after polishing operations have been completed at platen 1.

Figure 4:
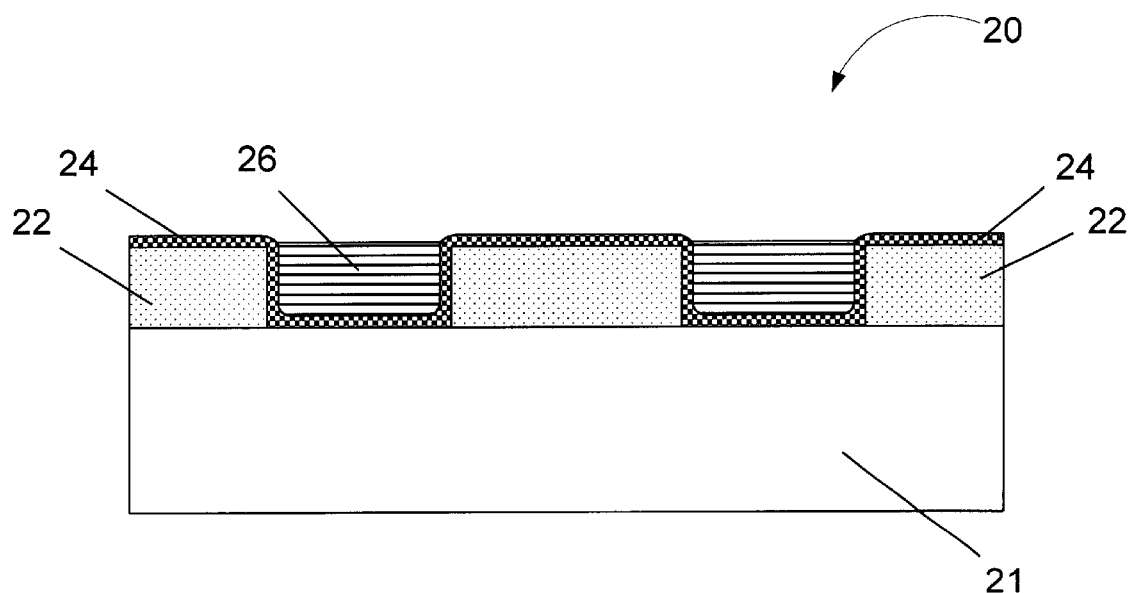
FIG. 4 is a cross-sectional view of the device shown in FIG. 3 after an endpoint polishing operation has been performed at a second polishing platen of the polishing tool.
Figure 5:
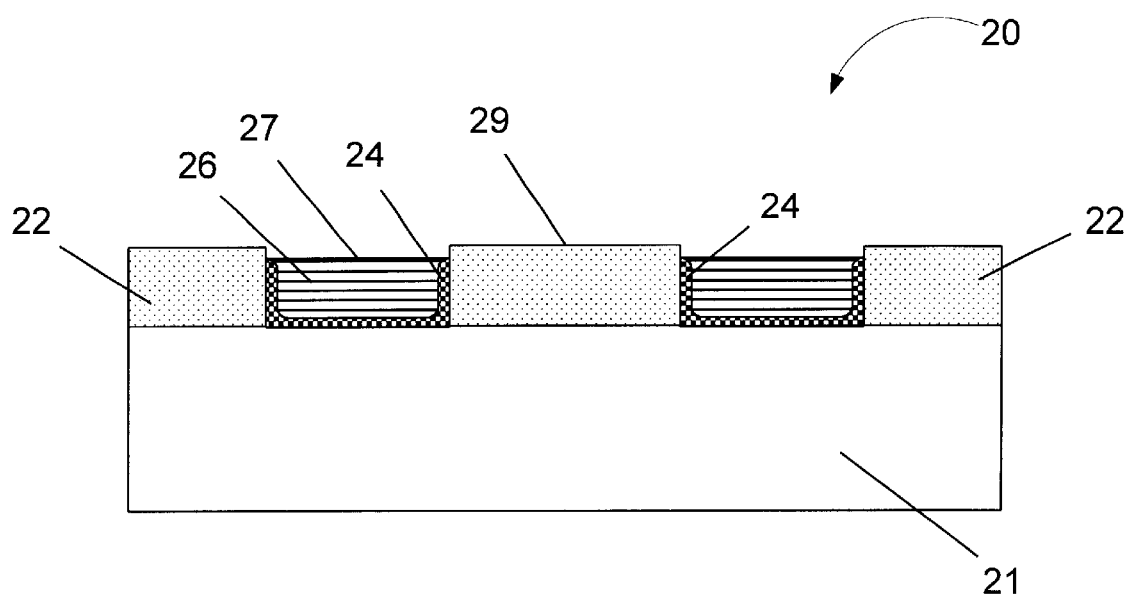
FIG. 5 is a cross-sectional view of the device shown in FIG. 4 after further timed polishing operations have been performed at the second polishing platen.
Figure 6:
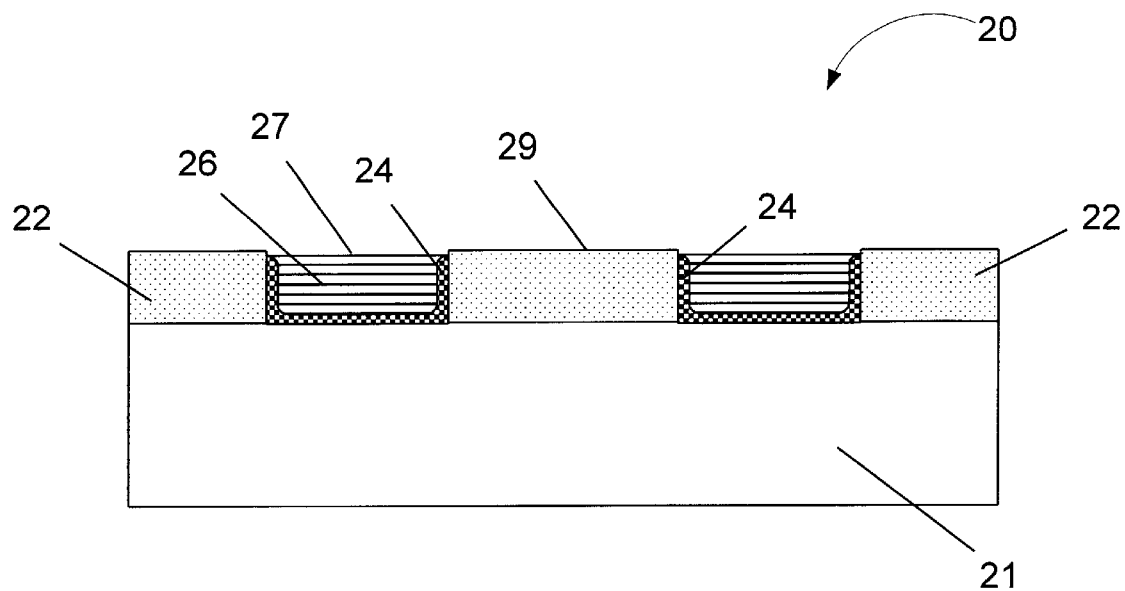
FIG. 6 is a cross-sectional view of the device shown in FIG. 5 after additional polishing operations are performed at a third polishing platen of the polishing tool.

At platen 2, the remaining copper layer 26 is removed at a much slower rate, e.g., on the order of approximately 6–10 nm/sec (60–100 Å/sec) by the use of a lower downforce pressure. This is an endpoint process that is stopped when an optical sensor on the polishing tool 10 detects when all of the copper has been removed, at least in the area where the optical sensor is focused, thereby exposing the barrier metal layer 24. This situation is depicted in FIG. 4. Thereafter, a timed overpolish process is performed for a set duration. This over-polish process is used to remove residual copper, as the endpoint process is not perfect, and to begin removing the barrier metal layer 24. FIG. 5 depicts the wafer after the timed over-polishing operations have been completed at platen 2 and a relatively small portion of the barrier metal layer 24 above the patterned layer of insulating material 22 is removed. Note that, at this point in the process, a surface 27 of the copper layer 26 is lower than a surface 29 of the insulating material layer 22 due to the overpolishing process selectively removing more of the copper layer 26 than the barrier metal layer 24.

At platen 3, a timed polishing process is performed to insure complete removal of the remaining portion of the barrier metal layer 24. See FIG. 6. During this process, some of the underlying layer of insulating material 22 is also removed. In some processing recipes, there may be a targeted erosion of the patterned layer of insulating material 22 of approximately 30 nm, for example, during this process.

As set forth in the background section of this application, the duration of the endpoint copper removal process performed at platen 2 varies over a relatively wide range of values. For example, the endpoint copper polish process at platen 2 may vary from 20–80 seconds. Ideally, the duration of the endpoint process will be relatively short, and it will only vary by a relatively small amount. For example, in one illustrative embodiment, it may be desired that the duration of the endpoint process may vary between 30–45 seconds (for eight-inch diameter wafers) and may have a median value of approximately 40 seconds. Of course, this endpoint polish process is performed after a timed polish process has been performed at platen 1.

In one illustrative embodiment, the present invention is directed to modeling the endpoint process to determine factors that may impact the duration of the endpoint process, and determining the correlation of those factors with the duration of the endpoint process. For example, factors such as the incoming thickness of the process layer 26, the life of the polishing pad 40, the life of the pad conditioner, the life of the wafer carrier 42, changes in polishing slurry 44, the rotational speed of the polishing pad 40, the oscillation of the polishing arm 41 carrying the wafer 23, and the downforce of the polishing arm 41, etc., may impact the duration of the endpoint process.

Thus, by modeling the endpoint process, the factors that tend to increase or decrease the duration of the endpoint process may be determined. Moreover, by modeling this endpoint process, the relative impact of all of the factors contributing to the duration of the endpoint process may be determined. For example, it may be the case that the polishing arm 41 downforce is more responsible for the duration of the endpoint process than the composition of the polishing slurry 44, or vice versa. Having this information, if the duration of the endpoint process is outside of an acceptable range, or target range, then adjustment may be made to one or more of these factors to control or return the duration of the endpoint process to within acceptable limits. Based upon the results of the modeling, the factors to be adjusted may, in one embodiment, be arranged in a hierarchy of factors to be adjusted. That is, the factor with the greatest impact may be adjusted first, and the factor with the least impact may be adjusted last.

Figure 7:
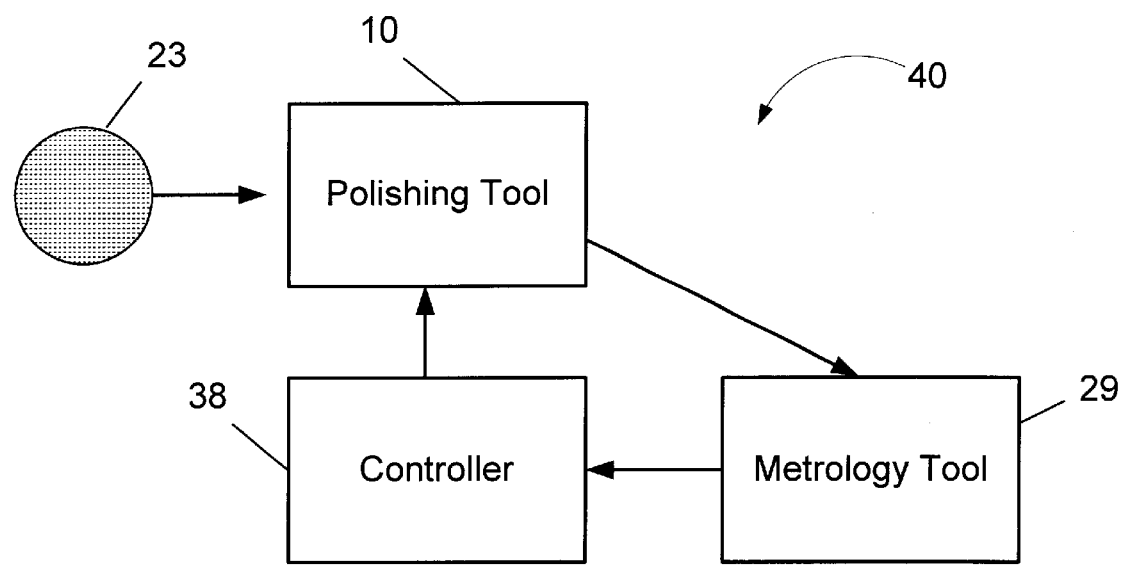
FIG. 7 is a schematic depiction of one embodiment of a system in which the present invention may be employed.

An illustrative system 40 that may be used in one embodiment of the present invention is shown in FIG. 7. The system 40 is comprised of a polishing tool 10, a controller 38, and a metrology tool 29. In the depicted embodiment, the metrology tool 29 is simply an optical sensor that determines when substantially all of the process layer 26 is removed from the area under observation. As indicated in FIG. 7, one or more wafers 23, having a process layer 26 formed thereabove, are provided to the polishing tool 10. The wafer 23 is subjected to the polishing operations described herein in the polishing tool 10.

More particularly, in the case where the process layer 26 is comprised of copper, it is subjected to endpoint polishing operations at platen 2 of the polishing tool 10. The controller 38 determines the duration of the endpoint process. Based on the duration of the endpoint process, the controller 38 predicts operating recipe parameters to affect the duration of the endpoint process for the next wafer or lot such that it is closer to a target value or range of values. The factors that may affect the duration of the endpoint process include those identified above.

In changing the recipe, the process controller 38 may change one or more parameters within a baseline recipe or, alternatively, the process controller 38 may provide an entirely new recipe. For example, the process controller 38 may incrementally increase or decrease the polishing arm 41 downforce and/or the rotational speed of the pad 40 in the recipe, or it may determine a new polishing arm 41 downforce value and a new rotational speed for the pad 40 based upon the determined duration of the endpoint process.

The endpoint model may be generated by the process controller 38, or alternatively, it may be generated by a different processing resource (not shown) and stored on the process controller 38 after being developed. The endpoint model may be developed using the polishing tool 10 or on a different tool (not shown) having similar operating characteristics. For purposes of illustration, it is assumed that the endpoint model is generated and updated by the process controller 38 or other processing resource based on actual performance of the polishing tool 10. The endpoint model is trained based on historical data collected from numerous processing runs of the polishing tool 10.

Various modeling techniques, well known to those of ordinary skill in the art, are suitable for implementing the endpoint model. The control model may be developed empirically using commonly known linear or non-linear techniques. The control model may be a relatively simple equation-based model (e.g., linear, exponential, weighted average, etc.) or a more complex model, such as a neural network model, principal component analysis (PCA) model, or a projection to latent structures (PLS) model. The specific implementation of the model may vary depending on the modeling technique selected.

Once the endpoint model is sufficient tested and/or trained, it may be used in a production environment to predict the operation of polishing tool 10. The process controller 38 predicts the endpoint polishing parameters, and the operating recipe of the polishing tool 10 is modified accordingly. In the production environment, the duration of the endpoint process is provided as feedback to the process controller 38 for updating the endpoint process model.

In one embodiment, the controller 38 determines, records or measures the duration of the endpoint process, typically through use of an internal timer. The determined duration may be for a single wafer or many wafers, and the results may be statistically analyzed, if deemed appropriate by the responsible process engineer. For example, the duration of the endpoint process may be averaged over a large sample of wafers. The controller 38 further determines if the duration of the endpoint process is within a preselected acceptable range. If it is, processing is allowed to continue. If it is outside of the acceptable range, the controller 38 may adjust one or more parameters of the endpoint polishing process performed on at least one subsequently processed wafer until such time as the duration of the endpoint process is within the preselected acceptable range. The parameters that may be adjusted include polishing arm 41 downforce, the rotational speed of the polishing pad 40, the rotational speed of the wafer 23, the oscillation length 46 of the polishing arm 41, the composition or amount of polishing slurry 44, the polishing pad 40 itself, including the type or composition of the pad 40, and the polishing pad conditioner.

In the illustrated embodiment, the controller 38 is a computer programmed with software to implement the functions described herein. Moreover, the functions described for the controller 38 may be performed by one or more controllers spread through the system. For example, the controller 38 may be a fab level controller that is used to control processing operations throughout all or a portion of a semiconductor manufacturing facility. Alternatively, the controller 38 may be a lower level computer that controls only portions or cells of the manufacturing facility. Moreover, the controller 38 may be a stand-alone device, or it may reside on the tool 30 or on a photolithography module (not shown). However, as will be appreciated by those of ordinary skill in the art, a hardware controller (not shown) designed to implement the particular functions may also be used.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 38, as described, is the Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

Figure 8:
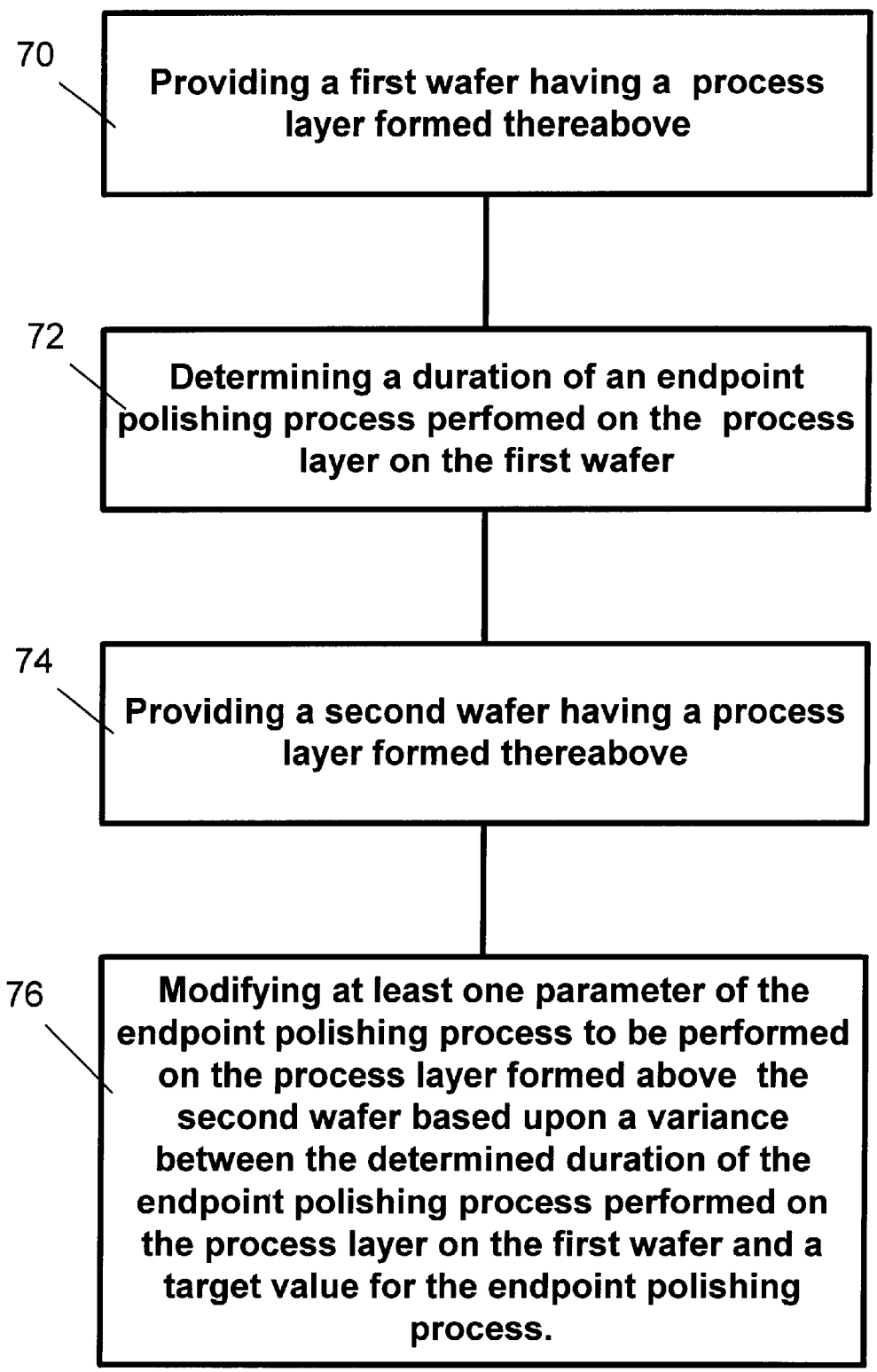
FIG. 8 is a flowchart depicting one illustrative embodiment of the present invention.

FIG. 8 depicts one illustrative embodiment of the present invention in flowchart form. As shown therein, the method comprises providing a first wafer having a process layer formed thereabove, as indicated at block 70, and determining a duration of an endpoint polishing process performed on the process layer on the first wafer, as set forth at block 72. The method further comprises providing a second wafer having a process layer formed thereabove, as recited at block 74, and modifying at least one parameter of the endpoint process to be performed on the process layer formed above the second wafer based upon a variance between the determined duration of the endpoint polishing process performed on the process layer formed on the first wafer and a target value for the endpoint polishing process, as indicated at block 76. The target value may be a single preselected value, or it may be a preselected range of values.

The present invention is also directed to a system for controlling the endpoint of chemical mechanical polishing operations performed on a process layer. In one illustrative embodiment, the system is comprised of a polishing tool for performing an endpoint polishing process on a process layer formed above a first wafer, a controller for determining a duration of the endpoint polishing process performed on the process layer on the first wafer, and a controller (the same or different one) for modifying at least one parameter of the endpoint polishing process to be performed on a process layer formed above a second wafer based upon a variation between the determined duration of the endpoint polishing process performed on the process layer on the first wafer and a target value for the endpoint polishing process.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

providing a first semiconducting wafer having a process layer formed thereabove;

determining a duration of an endpoint polishing process performed on said process layer on said first wafer;

providing a second semiconducting wafer having a process layer formed thereabove; and modifying at least one parameter of said endpoint polishing process to be performed on said process layer formed above said second semiconducting wafer based upon a variance between said determined duration of said endpoint polishing process performed on said process layer on said first wafer and a target value for said duration of said endpoint polishing process.

2. The method of claim 1, wherein providing a first semiconducting wafer having a process layer formed thereabove comprises providing a first semiconducting wafer having a process layer comprised of at least one of copper, aluminum, and tungsten formed thereabove.

3. The method of claim 1, wherein determining a duration of an endpoint polishing process performed on said process layer on said first wafer comprises measuring a duration of an endpoint polishing process performed on said process layer on said first wafer.

4. The method of claim 1, wherein modifying at least one parameter of an endpoint polishing process comprises modifying at least one of a polishing arm downforce, a rotational speed of a polishing pad, an oscillation length of a polishing arm, a rotational speed of said second semiconducting substrate, a composition of a polishing slurry used during said endpoint polishing process on said process layer on said second wafer, and a flow rate of said polishing slurry used during said endpoint polishing process on said process layer on said second wafer.

5. The method of claim 1, further comprising identifying a correlation between said duration of said endpoint polishing process and each of a plurality of parameters of said endpoint polishing process.

6. The method of claim 5, further comprising identifying a hierarchal ranking of said parameters of said endpoint polishing process based upon which of said parameters has the greatest impact on said duration of said endpoint polishing process.

7. The method of claim 1, wherein said target value for said duration of said endpoint polishing process on said process layer on said first wafer is a single value.

8. The method of claim 1, wherein said target value for said duration of said endpoint polishing process on said process layer on said first wafer is a range of values.

9. The method of claim 1, wherein said process layer on said second wafer is comprised of at least one of copper, aluminum and tungsten.

10. A method, comprising:
providing a first semiconducting wafer having a process layer comprised of at least one of copper, aluminum and tungsten formed thereabove;
measuring a duration of an endpoint polishing process performed on said process layer on said first wafer;
providing a second semiconducting wafer having a process layer formed thereabove; and
modifying at least one parameter of said endpoint polishing process to be performed on said process layer formed above said second semiconducting wafer based upon a variance between said determined duration of said endpoint polishing process performed on said process layer on said first wafer and a target value for said duration of said endpoint polishing process.

11. The method of claim 10, wherein modifying at least one parameter of an endpoint polishing process comprises modifying at least one of a polishing arm downforce, a rotational speed of a polishing pad, an oscillation length of a polishing arm, a rotational speed of said second semiconducting substrate, a composition of a polishing slurry used during said endpoint polishing process on said process layer on said second wafer, and a flow rate of said polishing slurry used during said endpoint polishing process on said process layer on said second wafer.

12. The method of claim 10, further comprising identifying a correlation between said measured duration of said endpoint polishing process and each of a plurality of parameters of said endpoint polishing process.

13. The method of claim 12, further comprising identifying a hierarchal ranking of said parameters of said endpoint polishing process based upon which of said parameters has the greatest impact on said duration of said endpoint polishing process.

14. The method of claim 10, wherein said target value for said duration of said endpoint polishing process on said process layer on said first wafer is a single value.

15. The method of claim 10, wherein said target value for said duration of said endpoint polishing process on said process layer on said first wafer is a range of values.

16. The method of claim 10, wherein said process layer on said second wafer is comprised of at least one of copper, aluminum and tungsten.

17. A method, comprising:
providing a first semiconducting wafer having a process layer comprised of copper formed thereabove;
measuring a duration of an endpoint polishing process performed on said process layer on said first wafer;
providing a second semiconducting wafer having a process layer comprised of copper formed thereabove; and
modifying at least one parameter of said endpoint polishing process to be performed on said process layer on said second wafer based upon a variance between said determined duration of said endpoint polishing process performed on said process layer on said first wafer and a target value for said duration of said endpoint polishing process.

18. The method of claim 17, wherein modifying at least one parameter of an endpoint polishing process comprises modifying at least one of a polishing arm downforce, a rotational speed of a polishing pad, an oscillation length of a polishing arm, a rotational speed of said second semiconducting substrate, a composition of a polishing slurry used during said endpoint polishing process on said process layer on said second wafer, and a flow rate of said polishing slurry used during said endpoint polishing process on said process layer on said second wafer.

19. The method of claim 17, further comprising identifying a correlation between said measured duration of said endpoint polishing process and each of a plurality of parameters of said endpoint polishing process.

20. The method of claim 19, further comprising identifying a hierarchal ranking of said parameters of said endpoint polishing process based upon which of said parameters has the greatest impact on said duration of said endpoint polishing process.

21. The method of claim 17, wherein said target value for said duration of said endpoint polishing process on said process layer on said first wafer is a single value.

22. The method of claim 17, wherein said target value for said duration of said endpoint polishing process on said process layer on said first wafer is a range of values.

* * * * *